United States Patent [19]
Dorri et al.

[11] Patent Number: 5,345,208
[45] Date of Patent: Sep. 6, 1994

[54] POLE FACE DESIGN FOR A C-SHAPED SUPERCONDUCTING MAGNET

[75] Inventors: Bizhan Dorri, Clifton Park; Evangelos T. Laskaris, Schenectady; Gary Bedrosian, Delmar, all of N.Y.; Bu-Xin Xu, Florence, S.C.

[73] Assignee: General Electric Company, Schenectady, N.Y.

[21] Appl. No.: 67,183

[22] Filed: May 26, 1993

[51] Int. Cl.$^5$ .................. G01V 3/00; G01R 33/20
[52] U.S. Cl. .................. 335/301; 335/216; 324/318; 324/319
[58] Field of Search .................. 335/216, 296–301, 335/304, 306; 324/318, 319, 320; 128/653.1, 653.2, 653.5

[56] References Cited

U.S. PATENT DOCUMENTS

| | | | |
|---|---|---|---|
| 4,359,706 | 11/1982 | Flack | 335/281 |
| 4,818,966 | 4/1989 | Miyamoto et al. | 335/296 |
| 4,875,485 | 10/1989 | Matsutani | . |
| 4,924,198 | 5/1990 | Laskaris | . |
| 5,006,804 | 4/1991 | Dorri et al. | . |
| 5,008,624 | 4/1991 | Yoshida | . |
| 5,124,651 | 6/1992 | Danby et al. | . |
| 5,153,546 | 10/1992 | Laskaris | . |

OTHER PUBLICATIONS

U.S. Patent Application Serial No. 08/067,188, Filed May 26, 1993, Laskaris et al., entitled "C-Shaped Superconducting Magnet".

U.S. Patent Application Serial No. 08/067,189, Filed May 26, 1993, Dorri et al., entitled "Shimming System for a C-Shaped Superconducting Magnet".

U.S. Patent Application Serial No. 08/095,565, Filed Jul. 19, 1993, Dake et al., entitled "Open Architecture Magnetic Resonance Imaging Superconducting Magnet Assembly".

Primary Examiner—Gregory D. Thompson
Assistant Examiner—Ramon M. Barrera
Attorney, Agent, or Firm—Paul R. Webb, II

[57] ABSTRACT

This invention relates to a pole face design for superconducting magnets of the type that are C-shaped. Such structures of this type, generally, employ pole faces which homogenize the magnet field within the imaging volume.

4 Claims, 4 Drawing Sheets

POLE FACE DESIGN FOR A C-SHAPED SUPERCONDUCTING MAGNET

BACKGROUND OF THE INVENTION

1. Field of the Invention

This invention relates to a pole face design for superconducting magnets of the type that are C-shaped. Such structures of this type, generally, employ pole faces which homogenize the magnet field within the imaging volume.

2. Description of the Related Art

The present superconducting magnetic resonance imaging (MRI) magnets require cryogens to operate, either liquid helium or liquid helium and liquid nitrogen. Liquid helium is used in superconducting magnets not only for cooling but also to stabilize the magnet windings against motion induced instabilities. Cryogens evaporate and are lost during magnet operation and, therefore, require periodic cryogen delivery service and cryogen addition, with the attendant cryogen safety hazards. Furthermore, the use of cryogens complicate the cryostat construction since the cryogen containment vessels must be built in accordance with pressure vessel codes to withstand pressure surges as a result of magnet quenches or loss of vacuum in the vessel surrounding the cryogen containment vessel. The heavy cryostat containment vessel requires complicated supports and shields to position the cryostat containment vessel in the vacuum vessel and yet minimize heat conduction and radiation to the containment vessel from the ambient temperatures surrounding the vacuum vessel.

Helium leaks into the vacuum vessel surrounding the cryostat containment vessel are a common cause of failure in most superconducting magnets. Helium gas leaking into the vacuum vessel provides high heat conduction from the ambient temperature surrounding the vacuum vessel to the cryogen containment vessel containing the superconducting coils.

Cryogen costs, specifically helium, are increasing and there is a limited supply which is economically recoverable. In many parts of the world helium is not available, therefore MRI systems based on niobium titanium (NbTi) superconductors cannot be operated. Therefore, a more advantageous superconducting magnet, then, would be presented if such amounts of the cryogen could be substantially reduced or eliminated.

Exemplary of such prior art magnets which do not employ cryogens and which also allow patients to be imaged while either standing up or lying down is commonly assigned U.S. Pat. No. 4,924,198 ('198) to E. T. Laskaris, entitled "Superconducting Magnetic Resonance Magnet Without Cryogens". However, while it is advantageous to be able to image patients while they are in a variety of positions, the magnet must be constructed such that the patients are capable of entering the magnet and being imaged quickly such that the patients should not experience any claustrophobia while being imaged. In particular, the '198 patent employs supports which provide a gap between the coil pairs. These supports are needed in order to provide adequate structural strength for the coil pairs. However, the imaging process could be quickened especially when imaging is being done on a patient who is standing up, if the patient could simply walk into an open area between the coil pairs instead of having to walk around the supports. Also, just prior to or while the patient is being imaged, if the patient did not see the supports, possibly any anxiety or claustrophobia the patient may have, would be eliminated. Consequently, a still further advantageous superconducting magnet, then, would be presented if such amounts of imaging time and possible patient anxiety or claustrophobia could be reduced while avoiding the use of cryogens.

Exemplary of such prior art superconducting magnets which do not employ cryogens and which reduce patient anxiety or claustrophobia is commonly assigned U.S. Pat. No. 5,153,546 ('546), entitled "Open MRI Magnet" to E. T. Laskaris. While the '546 patent has met with a degree of commercial success, it is made up, of necessity, of a large amount of superconducting tape. Typically, over 50,000 feet of superconducting tape are required in the '546 patent. Presently, superconducting tape costs over twenty cents per foot. Therefore, the cost of the superconducting tape alone in the '546 patent can make the '546 patent quite expensive. Also, it would be desirable to be able to shim the magnet so as to homogenize the magnetic field within the imaging volume. Therefore, an even still further advantageous superconducting magnet, then, would be presented if such amounts of superconducting tape were reduced while eliminating claustrophobic effects and cryogens and homogenizing the magnetic field within the imaging volume.

It is apparent from the above that there exists a need in the art for a superconducting magnet which is cryogen free, and which is capable of eliminating the claustrophobic effects associated with enclosed superconducting magnets, which at the same time uses only a small amount of superconducting tape while being capable of homogenizing the magnetic field within the imaging volume. It is a purpose of this invention to fill this and other needs in the art in a manner more apparent to the skilled artist and once given the following disclosure.

SUMMARY OF THE INVENTION

Generally speaking, this invention fulfills these needs by providing a C-shaped superconducting magnet, comprising a superconducting coil means, a ferromagnetic core means operatively connected to said coil means, and first and second pole pieces operatively connected to said core means and which are located at a predetermined distance away from each other to provide a gap between said first and second pole pieces such that said first and second pole pieces are further comprised of a passive shim means located adjacent to said first and second pole pieces.

In some preferred embodiments, the superconducting coil means includes a superconducting winding, a thermal shield, a vacuum envelope, and a cryocooler. Also, the ferromagnetic core means is constructed of iron. Finally, the shim means include shimming trays and passive shims.

In another further preferred embodiment, the C-shaped magnet provides more access and costs less than conventional superconducting magnets by reducing the use of superconducting materials while homogenizing the magnetic field within the imaging volume.

The preferred superconducting magnet, according to this invention, offers the following advantages: reduced use of superconducting materials; excellent imaging characteristics; excellent economy; homogenized magnetic field within the imaging volume; good durability;

and high strength for safety. In fact, in many of the preferred embodiments, these factors of reduced superconducting materials usage, imaging characteristics, homogenized magnetic field, and economy, are optimized to an extent that is considerably higher than heretofore achieved in prior, known superconducting magnets.

BRIEF DESCRIPTION OF THE DRAWINGS

The above and other features of the present invention which will become more apparent as the description proceeds are best understood by considering the following detailed description in conjunction with the accompanying drawings when like characters represent like parts throughout the several views and in which.

DETAILED DESCRIPTION OF THE INVENTION

Figure 1:
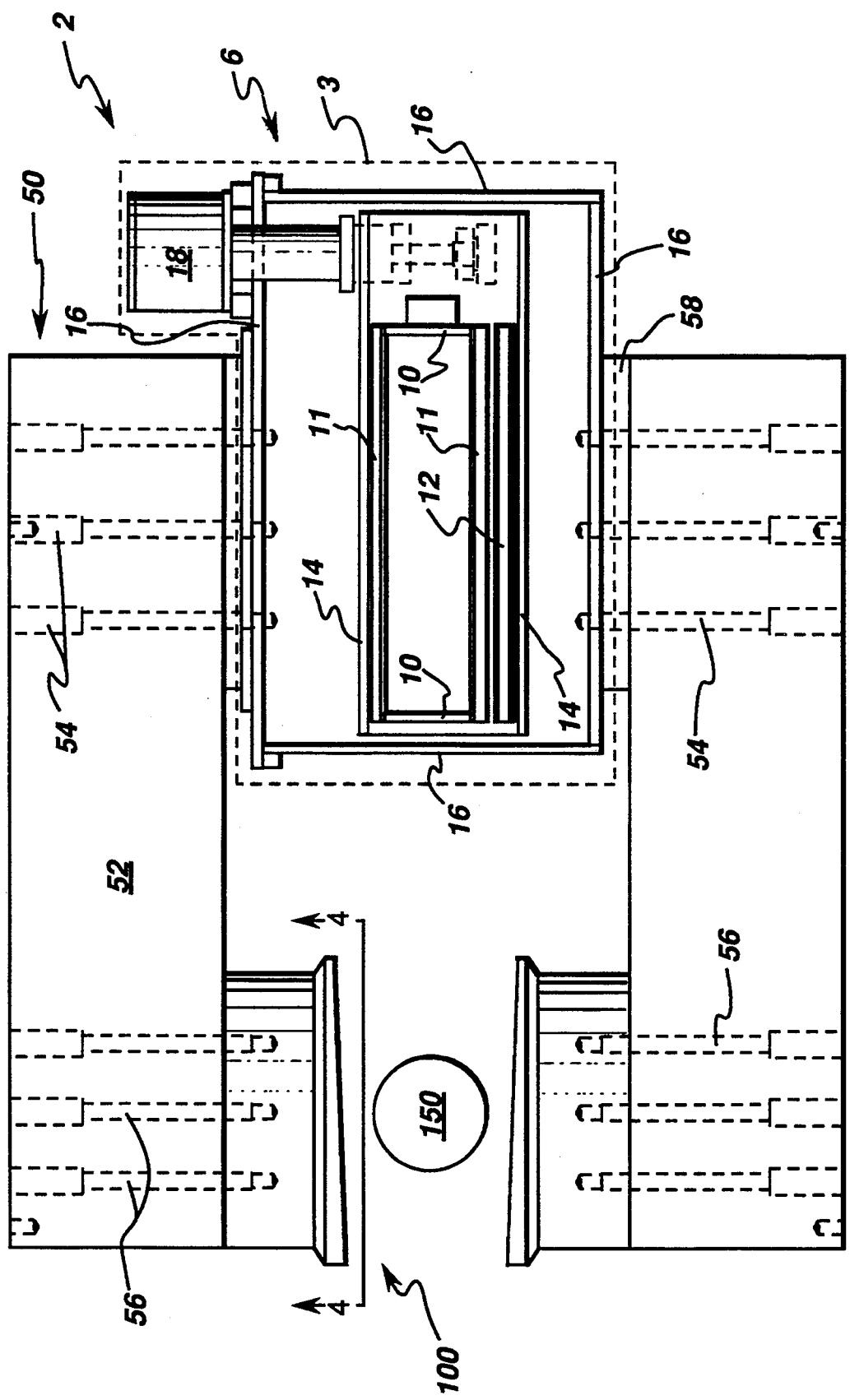
FIG. 1 is a schematic illustration of a C-shaped superconducting magnet, according to the present invention.

With reference first to FIG. 1, there is illustrated C-shaped superconducting magnet 2. Magnet 2 includes in part, superconducting coil assembly 6, ferromagnetic core assembly 50, pole piece assembly 100, and imaging volume 150. In particular, superconducting coil assembly 6 includes, in part, conventional superconducting windings 10, coil form 11, conventional superconducting switch 12, conventional thermal shield 14, conventional vacuum envelope 16, and conventional cryocooler 18. Coil form 11, preferably, is constructed of fiber reinforced epoxy (FRE) composite. Also, switch 12, preferably, is constructed of copper laminated superconducting tape. Vacuum envelope 16, preferably, is constructed of non-magnetic stainless steel (NMSS). Finally, cryocooler 18, preferably, is a conventional Gifford-McMahon cryocooler.

Superconducting coil assembly 6, preferably, is attached to core assembly 50 by conventional welding. Core assembly 50 includes in part, ferromagnetic cores 52 and 58. Cores 52 and 58, preferably, are constructed of any suitable ferromagnetic material such as iron. Core 58 is attached to cores 52 by conventional fasteners 54.

Located away from superconducting coil assembly 6 is pole piece assembly 100. Pole piece assembly 100, preferably, is attached to core assembly 50 by conventional fasteners 56. Located adjacent to pole piece assembly 100 is imaging volume 150. Preferably, volume 150 is approximately a 10 cm diameter sphere imaging volume.

Figure 2:
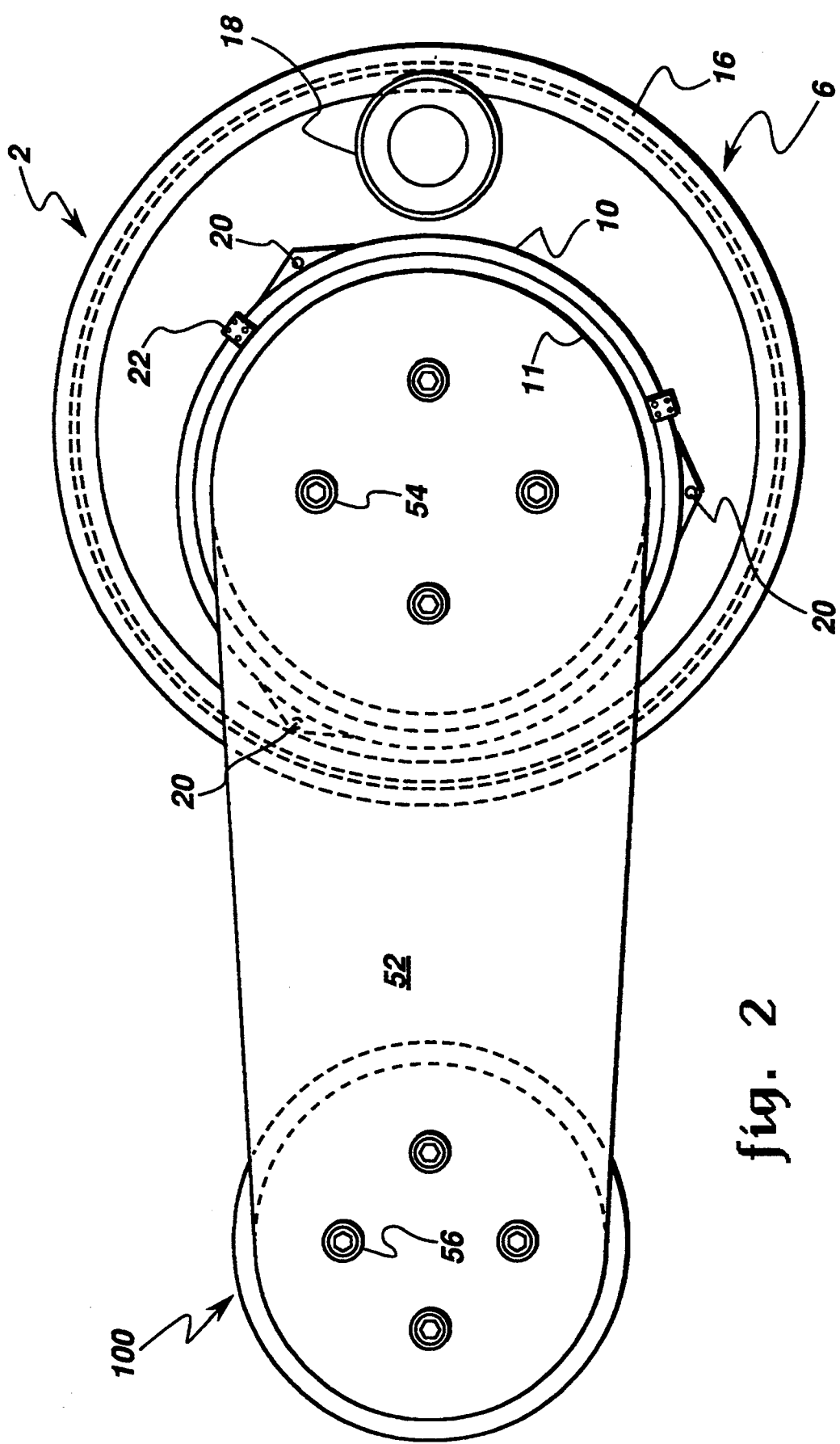
FIG. 2 is a schematic top view of the C-shaped superconducting magnet, according to the present invention.

FIG. 2 illustrates a top view of C-shaped superconducting magnet 2. In particular, as shown in FIG. 2, coil form 11 is suspended within vacuum envelope 16 by inconel suspension rods 20. Rods 20, preferably, are constructed of inconel. Preferably, suspensions 20 are three in number and are located equidistantly around coil form 11 to provide maximum support of coil form 11 within vacuum envelope 16. Also shown in FIG. 2 are superconducting leads 22. Leads 22, preferably, are constructed of copper and are attached to coil form 11 by conventional fasteners (not shown).

With respect to cores 52, it can be seen that cores 52 are tapered as cores 52 extend from vacuum envelope 16 towards pole piece assembly 100. Cores 52 are tapered in order to reduce the weight of core assembly 50.

Figure 3:
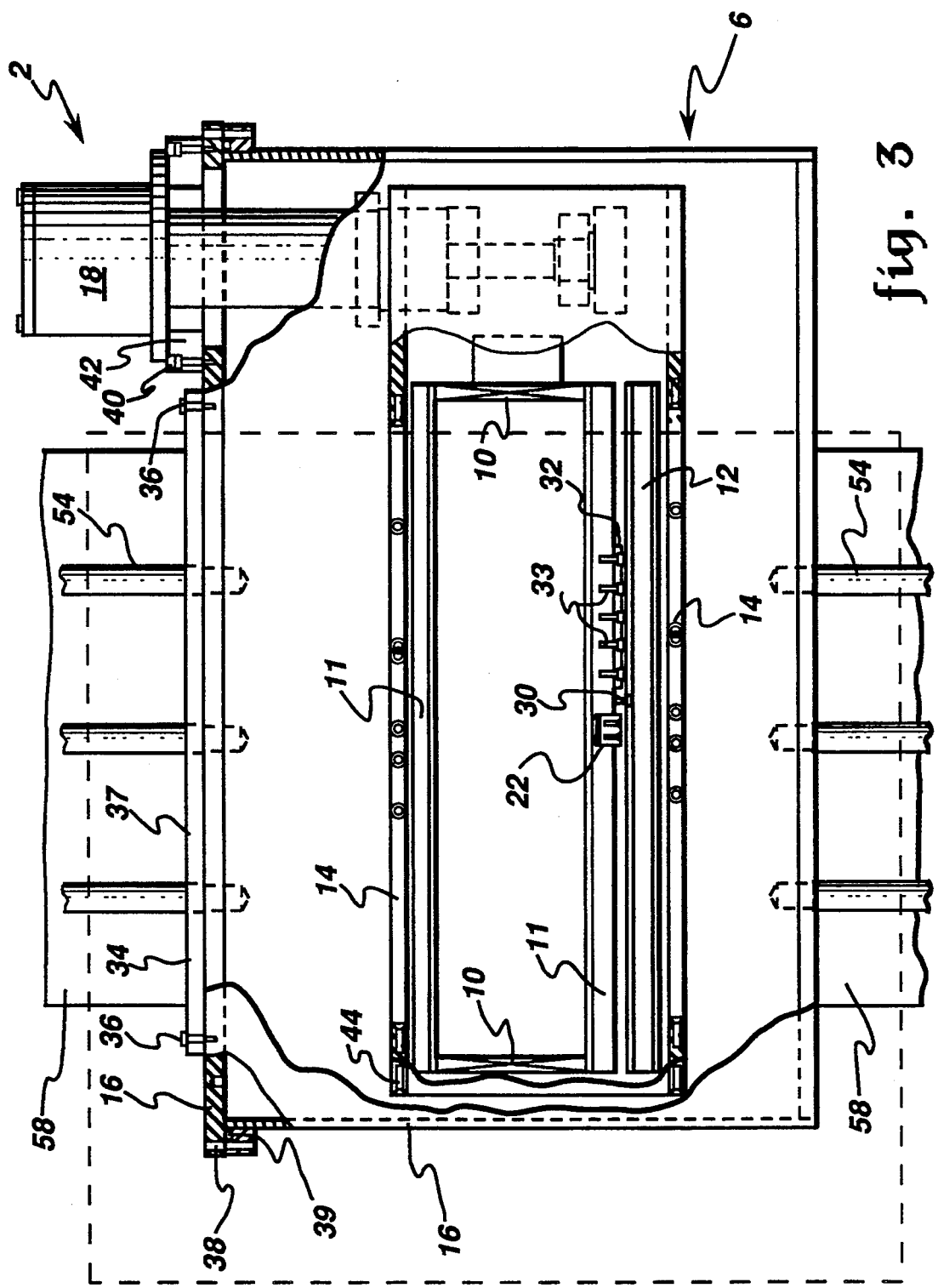
FIG. 3 is a detailed view, taken from FIG. 1 along dotted area 3, of the superconducting coil of the C-shaped superconducting magnet, according to the present invention.

FIG. 3 shows a more detailed illustration of superconducting coil assembly 6. As discussed earlier, superconducting coil assembly 6 includes in part, coil form 11, winding 10, coil form 11, superconducting switch 12, thermal shield 14, vacuum enclosure 16, and cryocooler 18. As can be seen more clearly in FIG. 3, coil form 11 is operatively connected to switch 12 by a conventional fastener 30. Also, coil form 11 is operatively connected to suspension rods 20 by bracket 32 and conventional fasteners 33. Superconductive leads 22 are attached to coil form 11. Leads 22 are used to provide electrical power to coil form 11. A conventional ring plate 34 is used to attach vacuum enclosure 16 to plate 37. Conventional fasteners 36 are used to attach plate 34 to vacuum enclosure 16. Also, conventional fasteners 38 are used to attach the various parts of vacuum enclosure 16 together. Located adjacent to fasteners 38 are conventional elastomeric O-rings 39 which are used to keep gases from leaking into superconducting coil assembly 6. Conventional fasteners 40 and blocks 42 are used to attach cryocooler 18 to vacuum enclosure 16. Finally, conventional fasteners 44 are used to attach the various elements of thermal shield 16 together.

Figure 4:
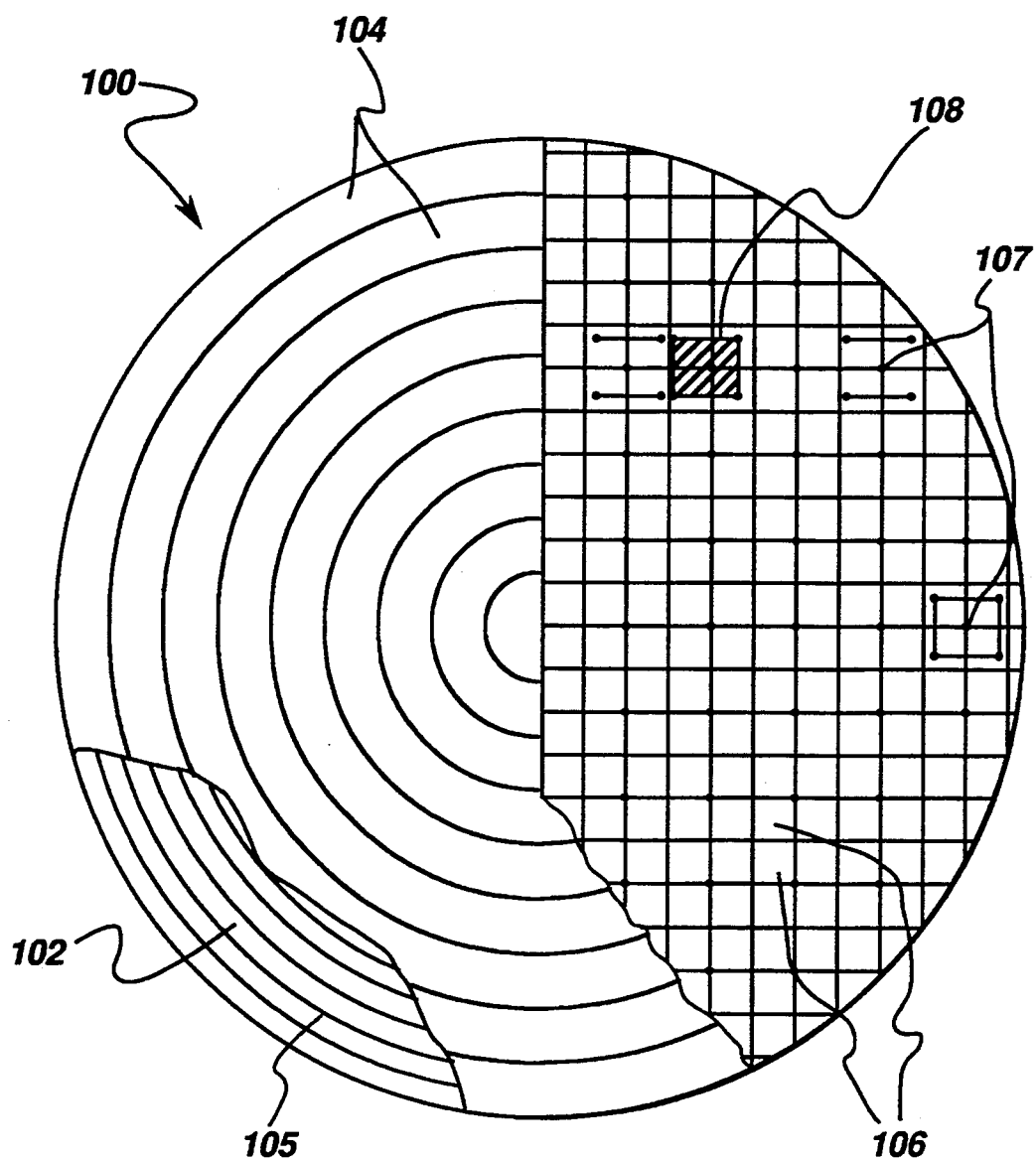
FIG. 4 is an end view, taken along lines 4—4 in FIG. 1 of the pole pieces of the C-shaped superconducting magnet, according to the present invention.

FIG. 4 illustrates an end view of pole plate assembly 100. Assembly 100 includes in part, conventional pole plates 102, pole plate rings 104, shimming trays 106, passive shimming locations 107 and passive shims 108. Rings 104, preferably, are constructed of any suitable ferromagnetic material such as iron. Trays 106, preferably, are constructed of any suitable non-ferromagnetic material such as glass epoxy. Finally, passive shims 108, preferably, are constructed of any suitable ferromagnetic material such as iron.

The procedure for producing the proper ring alignment of rings 104 will now be discussed. First, a calibration for a base thickness of rings 104 is produced. This calibration can be produced in two ways. First, by executing a conventional 3D finite element code for every ring 104 and also without any rings 104 and subtracting the solution (from here on referred to as numerical calibration). Second, by executing the 3D finite element code once with all rings 104 present and using their calculated magnetizations from analytically calculating their effects (from here on referred to as the analytical calibration). Once the calibration is generated, an optimization program which optimizes the thickness of rings 104 in order to achieve the best homogeneity is executed. The preferred optimization program is that which is set forth in commonly assigned U.S. Pat. No. 5,045,794 ('794) to Dorri et al. entitled "Method of Optimizing Passive Shim Placement in Magnetic Resonance Magnets". This program uses the previously patented passive shimming optimization technique and produces proper thickness of rings 104 (positive or negative). Once an arrangement of rings 104 is produced, another 3D finite element analysis is performed in order to evaluate the effectiveness of rings 104. Iterations are performed until proper convergence is achieved.

Circular passive shimming trays 106 are attached to rings 104 by conventional fastening techniques. Passive shims 108 which, preferably, are approximately 3×3 cm.² and have thicknesses ranging from 0.001 to 1.0 inches are placed at shimming locations 107 on each one of trays 106 in order to homogenize the magnetic field within imaging volume 150. The previously patented optimization procedure set as forth in the '794 patent is used in order to determine the locations 107 and thicknesses of shims 108.

Passive shimming of magnet 2 is done in two consecutive approaches. First, during design cycle, any homogeneity which cannot be corrected by the shaping of pole assembly 100 is tested for passive shimming corrections. After manufacturing, any field inhomogeneity within imaging volume 150 is corrected by passive shimming. Calibrations for shim effectiveness are first done by repeatedly exercising the previously described 3D finite element computer program or by conventional analytical closed-form techniques. After magnet 2 is built, more precise calibrations are done by placing a reference thickness shim 108 at each location 107 and measuring the effect of the shim 108 at all of the mapping points over the imaging volume 150.

During the operation of magnet 2, the magnetic field is produced by superconducting coil assembly 6 and is channeled and enhanced by C-shaped core assembly 50 and pole piece assembly 100. Thereby, a relatively strong magnetic field is produced between the pole pieces of pole piece assembly 100 to create imaging volume 150.

The size and shape of the C-shaped cores 52 and pole piece assembly 100, as well as, the ampere turns of superconducting coil assembly 6 are concurrently designed in order to produce a desired field, preferably, 0.3 tesla, between pole plates 102. The previously described 3D non-linear electromagnetic finite element analysis is used iteratively in order to properly design magnet 2 for a desired amount of inhomogeneity within imaging volume 150.

Several techniques are used in order to homogenize the magnetic field within imaging volume 150. In this case, initial inhomogeneity within volume 150 is calculated to be about 15,000 parts per million (ppm). The following two approaches are utilized for design field tolerance correction. First, the inhomogeneity introduced due to the existence of superconducting coil assembly 6 can be corrected by changing the angle of pole plates 102. This is done by multiple executions of the above-referenced 3D finite element analysis code. More specifically, a base case (no inclination of pole plates 102) and another case with small, i.e., 0.1 degree angle of pole plates 102 are analyzed and improvement of homogeneity within imaging volume 150 evaluated. This angle is iteratively adjusted (via analysis) for best homogeneity. It has been determined analytically that a small inclination angle can compensate for the asymmetry introduced by the presence of the superconducting coil assembly 6.

Second, an axisymmetric type inhomogeneity is present due to pole pieces 102. This inhomogeneity can be corrected by forming rings 104 on pole plates 102. These rings 104, preferably, have a radial width of 2.5 centimeters and each can have a different thickness in order to correct for field inhomogeneities. Moreover, grooves 105 can be machined in pole plates 102 in place of rings 104 for more inhomogeneity correction. The resultant inhomogeneity within imaging volume 150 is then dropped from 15,000 ppm to approximately 2000 ppm through the use of rings 104. After shims 108 are placed on top of rings 104, the inhomogeneity drops from 2000 ppm to approximately 10 to 20 ppm.

Once given the above disclosure, many of the features, modifications or improvements will become apparent to the skilled artisan. Such features, modifications or improvements are, therefore, considered to be a part of this invention, the scope of which is to be determined by the following claims.

What is claimed is:

1. A C-shaped superconducting magnet wherein said magnet is comprised of:

a superconducting coil means;

a ferromagnetic core means operatively connected to said coil means, and first and second pole pieces operatively connected to said core means and which are located at a predetermined distance away from each other to provide a gap between said first and second pole pieces such that said first and second pole pieces are each further comprised of a passive shim means located adjacent to said first and second pole pieces, wherein said passive shim means is further comprised of a ring means including a number greater than two of circumferentially-abutting concentric continuous rings of different thicknesses generally covering the face area of its associated pole piece, and wherein said passive shim means is further comprised of shimming trays attached to said rings and passive shims disposed on top of said rings on said shimming trays.

2. The magnet of claim 1, wherein said shimming trays are further comprised of a non-ferromagnetic material.

3. The magnet of claim 1, wherein said passive shims are further comprised of a ferromagnetic material.

4. The magnet of claim 3, wherein said passive shims are further comprised of iron.

* * * * *